United States Patent
Choi et al.

(10) Patent No.: US 8,415,872 B2
(45) Date of Patent: Apr. 9, 2013

(54) ORGANIC LIGHT EMITTING DIODE DISPLAY DEVICE

(75) Inventors: Sang-Moo Choi, Yongin (KR); Chul-Kyu Kang, Yongin (KR); Keum-Nam Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 231 days.

(21) Appl. No.: 13/033,460

(22) Filed: Feb. 23, 2011

(65) Prior Publication Data

US 2011/0241562 A1     Oct. 6, 2011

(30) Foreign Application Priority Data

Apr. 5, 2010    (KR) .................. 10-2010-0030980

(51) Int. Cl.
*H01J 1/62*     (2006.01)
(52) U.S. Cl.
USPC .......................... 313/498; 313/504; 313/506
(58) Field of Classification Search .......... 313/110–113, 313/498–512; 315/169.3; 257/59, 72
See application file for complete search history.

(56) References Cited

U.S. PATENT DOCUMENTS

| 7,132,801 | B2 * | 11/2006 | Park et al. | 315/169.3 |
| 7,825,584 | B2 * | 11/2010 | Kim | 313/504 |
| 7,834,547 | B2 * | 11/2010 | Kwon | 313/506 |
| 8,058,783 | B2 * | 11/2011 | Park et al. | 313/110 |
| 8,247,819 | B2 * | 8/2012 | Kim et al. | 257/72 |
| 2012/0107986 | A1 * | 5/2012 | Yokoyama et al. | 438/35 |

FOREIGN PATENT DOCUMENTS

| KR | 1020030045610 A | 6/2003 |
| KR | 10-2006-0065394 | 6/2006 |
| KR | 10-2006-0089977 | 8/2006 |

* cited by examiner

*Primary Examiner* — Tung X Le
(74) *Attorney, Agent, or Firm* — Robert E. Bushnell, Esq.

(57) ABSTRACT

An OLED display device includes a substrate; an organic light emitting element having a first electrode formed on the substrate, an organic emission layer disposed on the first electrode, and a second electrode disposed on the organic emission layer; a common power bus line disposed between the organic light emitting element and an edge of the substrate on the substrate and electrically connected with the first electrode; a driving power bus line neighboring the common power bus line on the substrate, disposed between the organic light emitting element and the edge of the substrate, and electrically connected with the second electrode extended from a portion corresponding to the organic emission layer; and a connection wire made of the same material as the second electrode on the common power bus line, separated from the second electrode, and electrically connected with the common power bus line.

19 Claims, 4 Drawing Sheets

ORGANIC LIGHT EMITTING DIODE DISPLAY DEVICE

CLAIM OF PROPERTY

This application makes reference to, incorporates the same herein, and claims all benefits accruing under 35 U.S.C. §119 from an application earlier filed in the Korean Intellectual Property Office on 5 Apr. 2010 and there duly assigned Serial No. 10-2010-0030980.

BACKGROUND OF THE INVENTION

1. Field of the Invention

The described technology relates generally to an organic light emitting diode (OLED) display device, and more particularly, to a large-sized OLED display device.

2. Description of the Related Art

An organic light emitting diode (OLED) display device has been recently spotlighted as a display device for displaying various images.

The above information disclosed in this Background section is only for enhancement of understanding of the background of the described technology and therefore it may contain information that does not form the prior art that is already known in this country to a person of ordinary skill in the art.

SUMMARY OF THE INVENTION

It is therefore one aspect of the present invention to provide an organic light emitting diode (OLED) display device that may minimize loss of common power and driving power respectively supplied to first and second electrodes of an organic light emitting element.

An OLED display device constructed with one aspect of the present invention includes a substrate; an organic light emitting element including a first electrode disposed on the substrate, an organic emission layer disposed on the first electrode, and a second electrode disposed on the organic emission layer; a common power bus line disposed between the organic light emitting element and an edge of the substrate on the substrate, and the common power bus line electrically connected with the first electrode; a driving power bus line neighboring the common power bus line on the substrate, the driving power bus line disposed between the organic light emitting element and the edge of the substrate. The driving power bus line is electrically connected with the second electrode that is extended from a portion corresponding to the organic emission layer; and a connection wire made of the same material forming the second electrode, is disposed on the common power bus line and physically separated from the second electrode, and the connection wire is electrically connected with the common power bus line.

The OLED display device may further include a protruding spacer interposed between the connection wire and the second electrode and a first dummy layer disposed on the spacer and made of the same material forming the second electrode.

The spacer may include a reverse taper-shaped side.

The OLED display device may further include a groove interposed between the connection wire and the second electrode, and a second dummy layer disposed on the groove and made of the same material as the second electrode.

The OLED display device may include a second dummy layer that covers the common power bus line and the driving power bus line, disposed in an insulation layer and a groove which is formed between the common power bus line and the driving power bus line, and the second dummy layer made of the same material as the second electrode.

The groove may expose the substrate.

The second electrode may electrically contact the driving power bus line.

The connection wire may electrically contact the common power bus line.

The OLED display device may further include a first auxiliary layer respectively electrically contacting the connection wire and the common power bus line between the connection wire and the common power bus line, and the first auxiliary layer that is made of the same material as the first electrode.

The OLED display device may further include a second auxiliary layer respectively electrically contacting the second electrode and the driving power bus line between the second electrode and the driving power bus line, and made of the same material as the first electrode.

The common power bus line may be disposed between the driving power bus line and the organic light emitting element.

The driving power bus line may be disposed between the common power bus line and the organic light emitting element.

In accordance with one of the above described embodiments, electrical resistance of each of the common power bus line and the driving power bus line may be reduced in order to minimize a loss of common power and driving power supplied to the first and second electrodes of the organic light emitting element so that the light efficiency of the organic light emitting element may be enhanced and the display quality of the OLED display device may be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
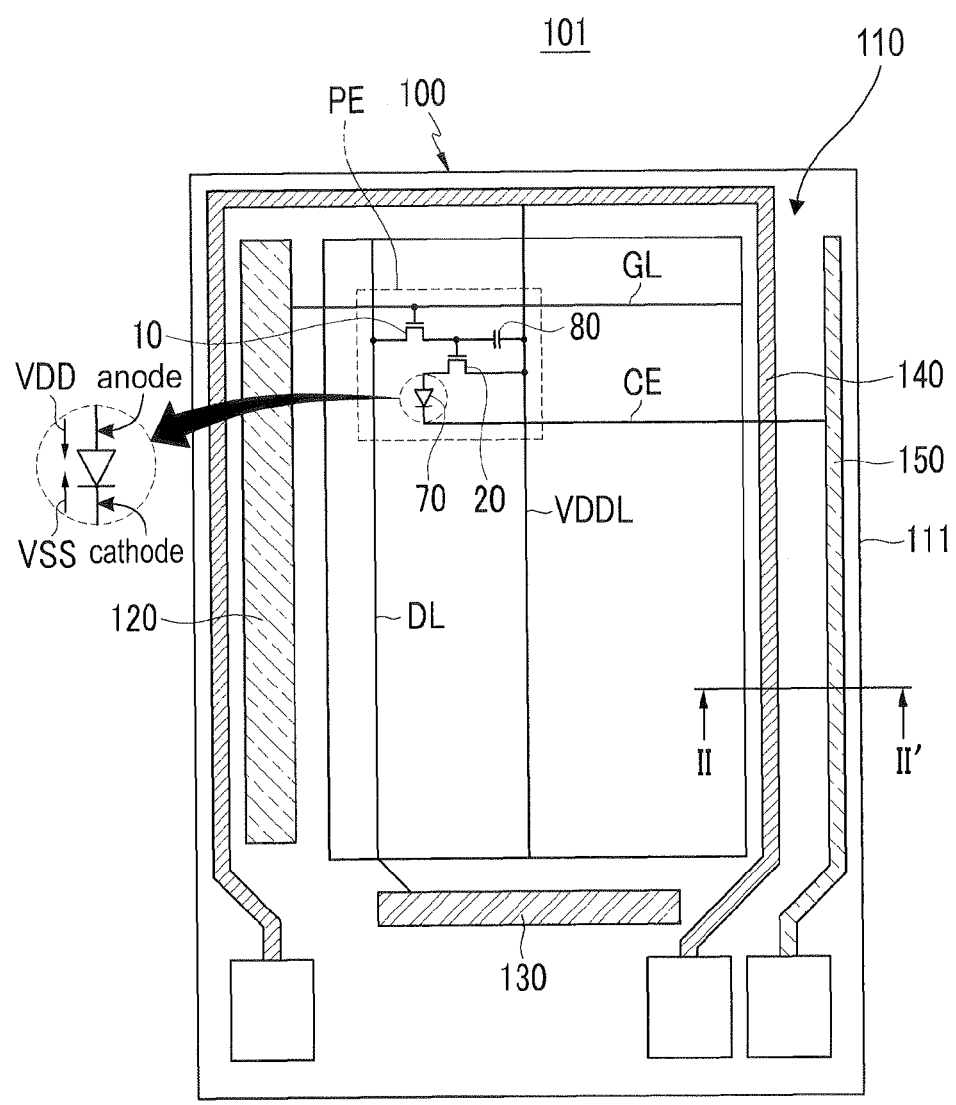
FIG. 1 is a top plan view of an organic light emitting diode (OLED) display device constructed as a first embodiment.

The organic light emitting diode display device has a self emissive characteristic, and differs from a liquid crystal display (LCD) in that the organic light emitting diode display device does not require a separate light source, and has a relatively smaller thickness and weight. Furthermore, the organic light emitting diode display device exhibits high quality characteristics such as lower power consumption, higher luminance and shorter response time.

A contemporary OLED display device includes an organic light emitting element having a substrate, a first electrode formed on the substrate, an organic emission layer disposed on the first electrode, and a second electrode disposed on the organic emission layer.

The contemporary OLED display device has a common power bus line supplying common power to the first electrode and a driving power bus line supplying driving power to the second electrode, respectively formed at an outmost side of the substrate where the organic light emitting element is formed.

Recently, the size of the OLED display device has been increased as the techniques for the fabrication and manufacture of the OLED display device have been developed, and accordingly, the common power bus line and the driving power bus line are increased in size.

Resistance of each of the common power bus line and the driving power bus line is however increased when the common power bus line and the driving power bus line are increased in size, so that common power and driving power respectively supplied to the first and second electrodes through the common power bus line and the driving power bus line are consequentially lost. Therefore, when loss of the common power and driving power respectively supplied to the first and second electrodes occurs, the light efficiency of the organic light emitting element deteriorates so that the display quality of the OLED display device is concomitantly reduced.

The above information disclosed is only for enhancement of understanding of the nature and the background of the described technology and therefore it may contain information that does not itself constitute prior art or information that is not already known in this country to a person of ordinary skill in the art.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Constituent elements having the same structures throughout the embodiments are denoted by the same reference numerals and are described in a first embodiment. In the subsequent embodiments, only the constituent elements other than the same constituent elements are described.

In the drawings, the sizes and thicknesses of the components are merely shown for convenience of explanation, and therefore the present invention is not necessarily limited to the illustrations described and shown herein.

In the drawings, the thickness of layers, films, panels, regions, etc., are exaggerated for clarity. In the drawings, the thicknesses of some layers and areas are exaggerated for convenience of explanation. When it is described that one element such as a layer, a film, an area, a plate, etc. is formed on another element, it means that one element exists right on, or in direct contact with another element, or that one element exists on another element with a further element interposed therebetween.

Throughout this specification and the claims that follow, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Hereinafter, an organic light emitting diode (OLED) display device 101 constructed as a first embodiment will be described with reference to FIG. 1 and FIG. 2.

FIG. 1 is a top plan view of an OLED display device constructed as a first embodiment.

Figure 2:
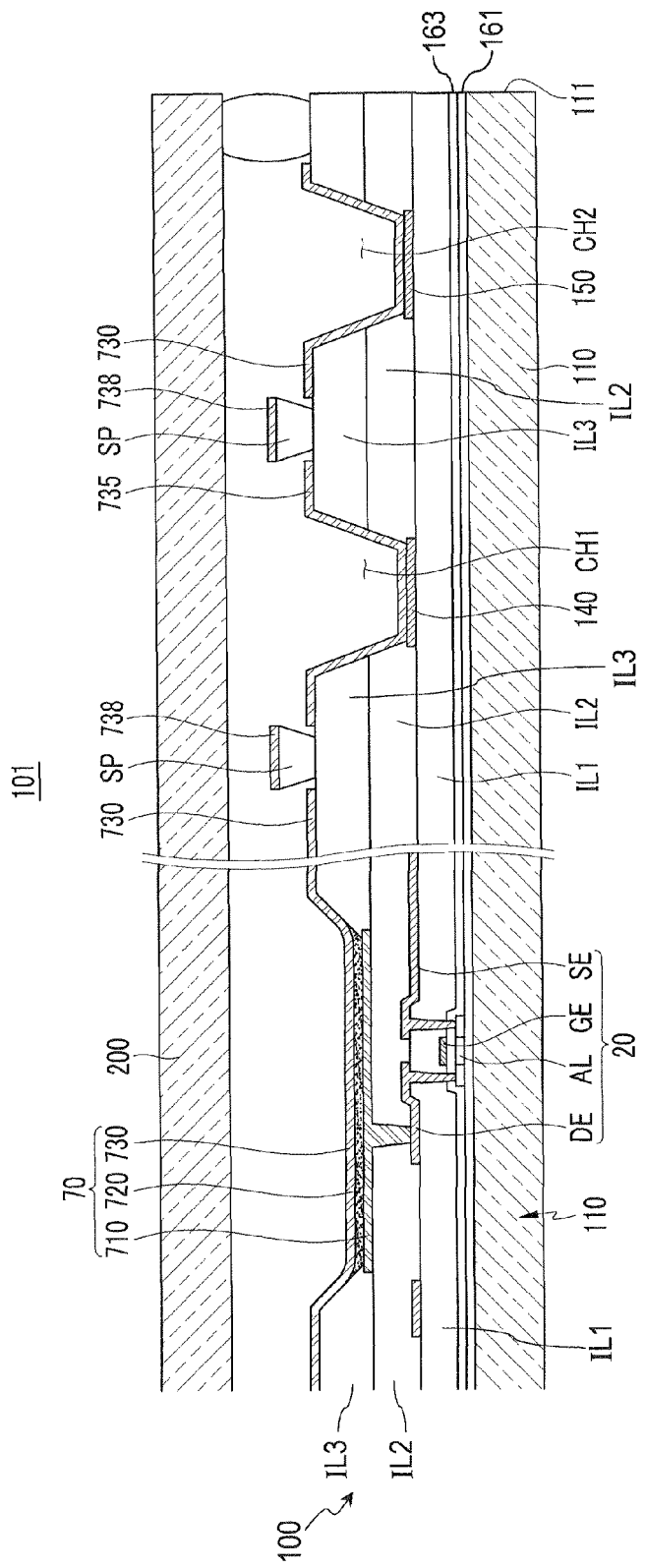
FIG. 2 is a partial cross-sectional view of FIG. 1, taken along the line

As shown in FIG. 1, the OLED display device 101 constructed as the first embodiment includes an element substrate 100 and an encapsulation substrate 200 (shown in FIG. 2). The encapsulation substrate 200 is disposed opposite to the element substrate 100 and the encapsulation substrate 200 is not shown in FIG. 1.

The element substrate 100 includes a substrate 110, an organic light emitting element 70, a gate driver 120, a data driver 130, a common power bus line 140, and a driving power bus line 150.

The substrate 110 is formed with an electrical insulating substrate such as glass or plastic, and a plurality of pixels PE are formed thereon.

Each pixel PE includes the organic light emitting element 70, and displays an image by selectively using light emitted from the organic light emitting element 70 in response to reception of image signals representative of the image.

A structure of the pixel PE will now be described in further detail.

In the OLED display device 101 constructed as the first embodiment, each pixel PE has a 2Tr-1Cap structure with an organic light emitting diode 70, two thin film transistors (TFTs) 10 and 20, and a capacitor 80. The first embodiment is however not limited thereto. The OLED display device 101 may be variously structured such that three or more thin film transistors and two or more capacitors are provided at one pixel PE together with a separate wire. The additional thin film transistor and capacitors form a compensation circuit.

The compensation circuit may improve the uniformity of the organic light emitting diode 70 formed at each pixel PE, and prevent the image quality from deviating. The compensation circuit may include between two to eight thin film transistors.

The organic light emitting diode 70 includes an anode that functions as a hole injection electrode to which holes are injected, a cathode that functions as an electron injection electrode to which electrons are injected, and an organic emissive layer disposed between the anode and the cathode.

One pixel PE may include a first thin film transistor 10 and a second thin film transistor 20.

Each of the first and second thin film transistors 10 and 20 includes a gate electrode, a semiconductor layer, a source electrode, and a drain electrode.

FIG. 1 illustrates a structure with a gate line GL, a data line DL, a common power line VDDL, and a cathode electrode CE in the pixel PE; however, the pixel PE included in the OLED display device 101 of the first embodiment is not limited to the structure shown in FIG. 1.

A source electrode of the first thin film transistor 10 is electrically connected to the data line DL extended from the data driver 130, and a gate electrode of the first thin film transistor 10 is electrically connected to the gate line GL extending from the gate driver 120. A node is formed between the drain electrode of the first thin film transistor 10 and the capacitor 80 so that a gate electrode of the second thin film transistor 20 is electrically connected to the capacitor 80. The common power line VDDL extending from the common power bus line 140 is electrically connected to a source electrode of the second thin film transistor 20, and an anode of the organic light emitting element 70 is electrically connected to a drain electrode of the second thin film transistor 20. A cathode CE of the organic light emitting element 70 is electrically connected with the driving power bus line 150 and extended from the driving power bus line 150.

The first thin film transistor 10 is used as a switch for selecting a pixel PE for light emission. When the first thin film transistor 10 turns on, the capacitor 80 is charged. At this time, the amount of the charges is proportional to the potential of the voltage applied from the data line DL. When the gate potential of the second thin film transistor 20 increases above a threshold voltage, the second thin film transistor 20 is turned on. Then, first power VDD which is common power that is applied to the common power line VDDL from the common power bus line 140, is applied to the anode of the organic light emitting element 70 through the second thin film transistor 20. Second power VSS which is the driving power is applied to the cathode CE of the organic light emitting element 70 from the driving power bus line 150, and consequentially, the organic light emitting element 70 emits light in response to the first power VDD that has been applied to the anode and the second power VSS that has been applied to the cathode CE through the second thin film transistor 20.

The structure of the pixel PE is not limited to as above-described; however, the structure of the pixel PE may be variously modified provided that such modifications may be easily appreciated and may be made by a person skilled in the art.

Each of the gate driver 120, the data driver 130, the common power bus line 140, and the driving power bus line 150 disposed between the organic light emitting element 70 and an edge 111 of the substrate 110, and the common power bus line 140, is electrically connected with the anode of the organic light emitting element 70 in order to supply the common power to the organic light emitting element 70. The driving power bus line 150 is electrically connected with the cathode CE of the organic light emitting element 70 to supply driving power to the cathode CE of the organic light emitting element 70. This will be described in further detail with reference to FIG. 2.

FIG. 2 is a cross-sectional view of FIG. 1, taken along the line II-II'. FIG. 2 illustrates the second thin film transistor 20 and the organic light emitting element 70 in the pixel PE of the OLED display device constructed as the first embodiment. In addition, FIG. 2 shows a partial cross-sectional view of the encapsulation substrate 200 and the element substrate 100 of FIG. 1 in the sealed state.

As shown in FIG. 2, the second thin film transistor 20 of the OLED display device 101 includes a semiconductor layer AL, a gate electrode GE, a source electrode SE, and a drain electrode DE.

The second thin film transistor 20 receives the first power VDD that is driving power for light emission of the organic light emitting element 70 in the selected pixel PE from the common power line VDDL and applies the same to a first electrode 710 of the organic light emitting element 70 through the source electrode SE, the semiconductor layer AL, and the drain electrode DE. The first electrode 710 of the organic light emitting element 70 is extended from the drain electrode DE, and the drain electrode DE and the first electrode 710 are electrically connected with each other. The source electrode SE and the drain electrode DE may be formed with the same material as the common power bus line 140 and the driving power bus line 150.

The organic light emitting element 70 includes a first electrode 710, an organic emission layer 720 formed on the first electrode 710, and a second electrode 730 formed on the organic emission layer 720.

The first electrode 710 may be an anode which is a hole injection electrode, and the second electrode 730 may be a cathode which is an electron injection electrode. The first embodiment is however not limited thereto. That is, the first electrode 710 may function as the cathode, while the second electrode 730 functions as the anode according to a driving method of the OLED display device 101, and in this case, the driving power may be supplied to the cathode and the common power may be applied to the anode. When the first power VDD which is the common power supplied from the common power bus line 140 is supplied to the first electrode 710 through the second thin film transistor 20 and the second power VSS which is the driving power supplied from the driving power bus line 150 is supplied to the second electrode 730, holes and electrons from the first and second electrodes 710 and 730 are injected into the organic emission layer 720, and emission of light from the organic emission layer 720 is made when the excitons being the combinations of the injected holes and electrodes drop from the excited state to the ground state.

The second electrode 730 is formed as one layer over the entire area of the plurality of pixels PE in a plan view of the pixel PE. The second electrode 730 continuously extends from a portion corresponding to a pixel PE including the organic emission layer 720 to a portion where the driving power bus line 150 is located.

In addition, the first electrode 710 and the second electrode 730 may include a single-layered or multi-layered light reflective conductive material or light transmissive conductive material including at least one of molybdenum (Mo), aluminum (Al), silver (Ag), indium tin oxide (ITO), and indium zinc oxide (IZO). As described, in the OLED display device 101 of the first embodiment, at least one of the first electrode 710 and the second electrode 730 of the organic light emitting element 70 may include a light-transmissive conductive material, and light emitted from the organic emission layer 270 to a direction of the at least one of first and second electrodes 710 and 720, including the light-transmissive conductive material is emitted to the exterior such that a front emission type, rear emission type, or dual emission type OLED display 101 may be realized.

The common power bus line 140 is disposed between the organic light emitting element 70 and the edge 111 of the substrate 110, and in further detail, the common power bus line 140 may be disposed between the driving power bus line 150 and the organic light emitting element 70. The common power bus line 140 is disposed on the substrate 110, with a first insulation layer IL1 interposed between the common power bus line 140 and the substrate 110, and the common power bus line 140 is electrically connected with the first electrode 710 through the common power line VDDL and the second thin film transistor 20 to supply the first power VDD to the first electrode 710. Corresponding to the common power bus line 140, a connection wire 735 is disposed on the common power bus line 140.

The connection wire 735 is disposed on the common power bus line 140, interposing a second insulation layer IL2 and a third insulation layer IL3 between a partial of the connection wire 735 and a partial of the common power bus line 140, and the connection wire 735 has electrical connection by contacting the common power bus line 140 through a first contact hole CH1. The first contact hole CH1 is formed within the second insulation layer IL2 and the third insulation layer IL3 in order to expose the common power bus line 140 and to electrically contact the common power bus line 140 to the connection wire 735. The connection wire 735 is formed through a process such as a deposition process that is the same as the deposition process used to form the second electrode 730. That is, the connection wire 735 is made of the same material as the second electrode 730. In one embodiment, the connection wire 735 may be simultaneously formed with the second electrode 730. The connection wire 735 is electrically separated from the second electrode 730, interposing a spacer SP between the connection wire 735 and the second electrode 730. The connection wire 735 may be physically separated from the second electrode 730 by interposing a spacer SP between the connection wire 735 and the second electrode 730. The connection wire 735 minimizes electrical resistance of the common power bus line 140 by electrically contacting the common power bus line 140, and accordingly, loss of the first power VDD supplied to the first electrode 710 through the common power bus line 140 may be minimized. The connection wire 735 may be disposed in direct physical contact with the common power bus line 140. The deposition of the connection wire 735 may minimize the electrical resistance of the common power bus line 140 because the electrical resistance of the combination of the common power bus line 140 and the connection wire 735 is less than that of the common power bus line 140 alone due to larger area of the cross section of the combination of the common power bus line 140 and the connection wire 735. That is, since the loss of the first power VDD, which is common electrical power supplied to the first electrode 710 of the organic light emitting element 70 is minimized, light efficiency of the organic light emitting element 70 is enhanced and accordingly the display quality of the OLED display device 101 may be improved.

The second electrode 730 extended from a portion corresponding to the organic emission layer 720 and electrically or/and physically separated from the connection wire 735, with the spacer SP interposed between the second electrode 730 and the connection wire 735, has an electrical connection with the driving power bus line 150 that is created by contacting a second contact hole CH2 formed in the second insulation layer IL2 and the third insulation layer IL3 to expose the driving power bus line 150. The second power VSS, which is driving power supplied from the driving power bus line 150, is supplied to the second electrode 730 corresponding to the organic emission layer 720 through the second electrode 730 contacting through the second contact hole CH2. As described, the second electrode 730 is in electrical contact with the driving power bus line 150 through the second contact hole CH2, and accordingly, the electrical resistance of the driving power bus line 150 and the second electrode 730 are minimized so that a loss of the second power VSS supplied to the second electrode 730 through driving power bus line 150 may be minimized. That is, since the loss of the second power VSS, which is driving power supplied to the second electrode 730 of the organic light emitting element 70 is minimized, light efficiency of the organic light emitting element 70 is enhanced and accordingly the display quality of the OLED display 101 can be improved. In one embodiment, the second electrode 730 may be in direct contact with the driving power bus line 150 through the second contact hole CH2.

The spacer SP is disposed between the connection wire 735 and the second electrode 730, and protrudes toward the encapsulation substrate 200 from the second insulation layer IL2. The spacer SP includes a reverse-taper shaped side so that the second electrode 730 and the connection wire 735 are electrically separated from each other when the second electrode 730 is formed over the entire area of the substrate 110 through one process such as a deposition process. That is, by using the spacer SP, the second electrode 730 and connection wire 735 are electrically and/or physically separately formed through one process forming the second electrode 730 without using an additional process such as an etching process, and accordingly, the second electrode 730 and the connection wire 735 may be prevented from be short-circuited, and the connection wire 735 is simultaneously formed when the second electrode 730 is formed so that electrical resistance of the common power bus line 140 may be minimized without an additional process. The spacer SP may maintain a gap between the element substrate 100 and encapsulation substrate 200, and may be integrally formed with the third insulation layer IL3. A first dummy layer 738 is formed on the spacer SP.

The first dummy layer 738 includes the same material as the second electrode 730, and is electrically separated with the second electrode 730 and the connection wire 735. In one embodiment, the first dummy layer 738 may be physically separated with the second electrode 730 and the connection wire 735. The first dummy layer 738 is formed simultaneously with the second electrode 730 and the connection wire 735, and is disposed on the spacer SP. The buffer layer 161 is disposed on the substrate 110. The gate insulating layer 163 is disposed to cover the semiconductor layer AL.

As described, in the OLED display device 101 constructed as the first embodiment, the common power bus line 140 contacts the connection wire 735 including the same material as the second electrode 730 to minimize the electrical resistance of the common power bus line to thereby minimize a loss of the first power VDD supplied to the first electrode 710 through the common power bus line 140, and the second electrode 730 contacts the driving power bus line 150 to minimize electrical resistance of the driving power bus line 150 and the second electrode 730 to thereby minimize a loss of the second power VSS supplied to the second electrode 730 through the driving power bus line 150. That is, the loss of the first power VDD and the loss of the second power VSS, respectively supplied to the first and second electrodes 710 and 730 of the organic light emitting element 70 of the OLED display 101 may be minimized, and accordingly, light efficiency of the organic light emitting element 70 may be enhanced and the display quality of the OLED display device 101 may be improved.

In addition, in the OLED display device 101 of the first embodiment, the connection wire 735 and the second electrode 730 are formed through one process for forming the second electrode 730 by the spacer SP so that electrical resistance of the driving power bus line 150 may be minimized without performing an additional process. That is, the electrical resistance of the driving power bus line 150 may be minimized without increasing the cost of fabrication and without incurring additional costs so that the display quality of the OLED display device 101 may be improved.

An OLED display device 102 constructed as a second embodiment will now be described with reference to FIG. 3 and FIG. 4 collectively.

Figure 3:
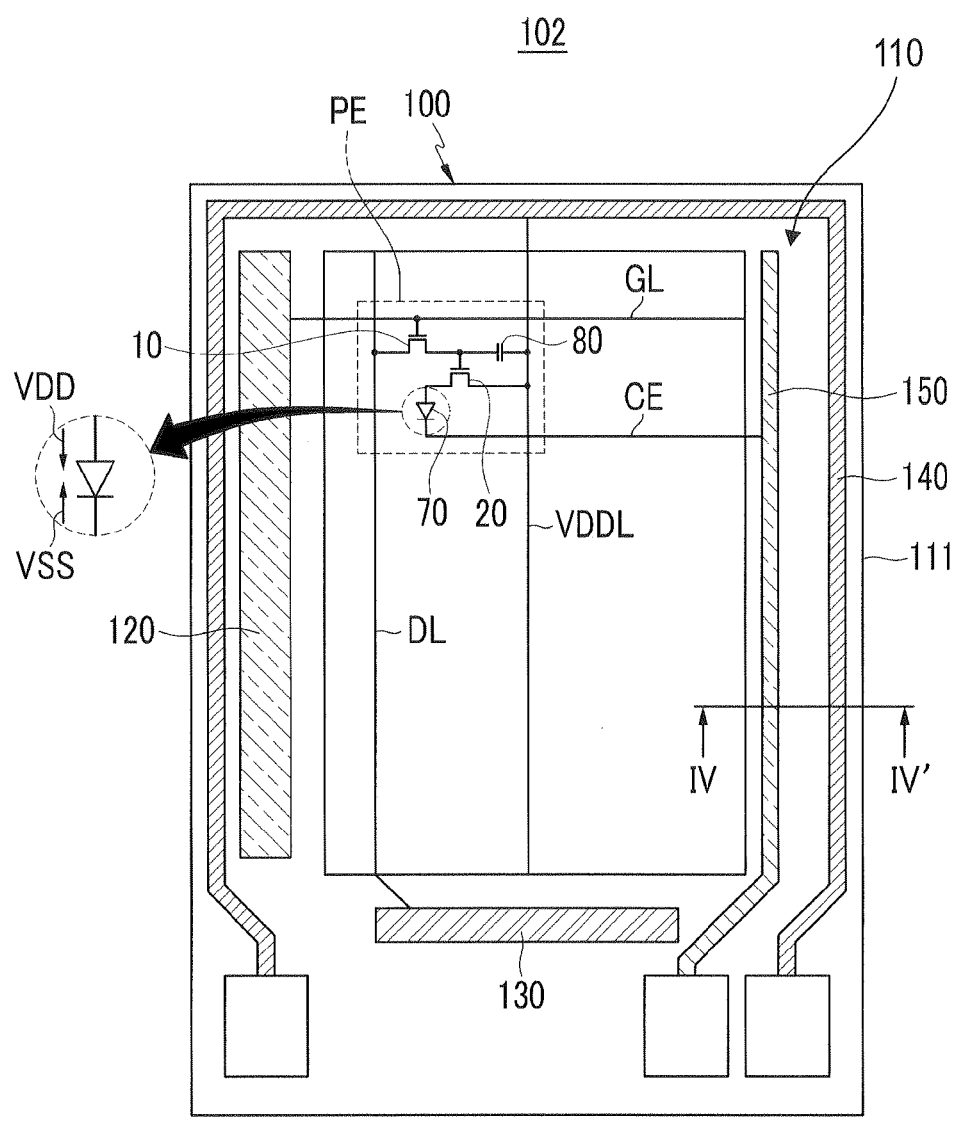
FIG. 3 is a top plan view of an OLED display device constructed as a second embodiment.

FIG. 3 is a top plan view of an OLED display device constructed as a second embodiment. FIG. 4 is a cross-sectional view of FIG. 3, taken along sectional line IV-IV'.

Figure 4:
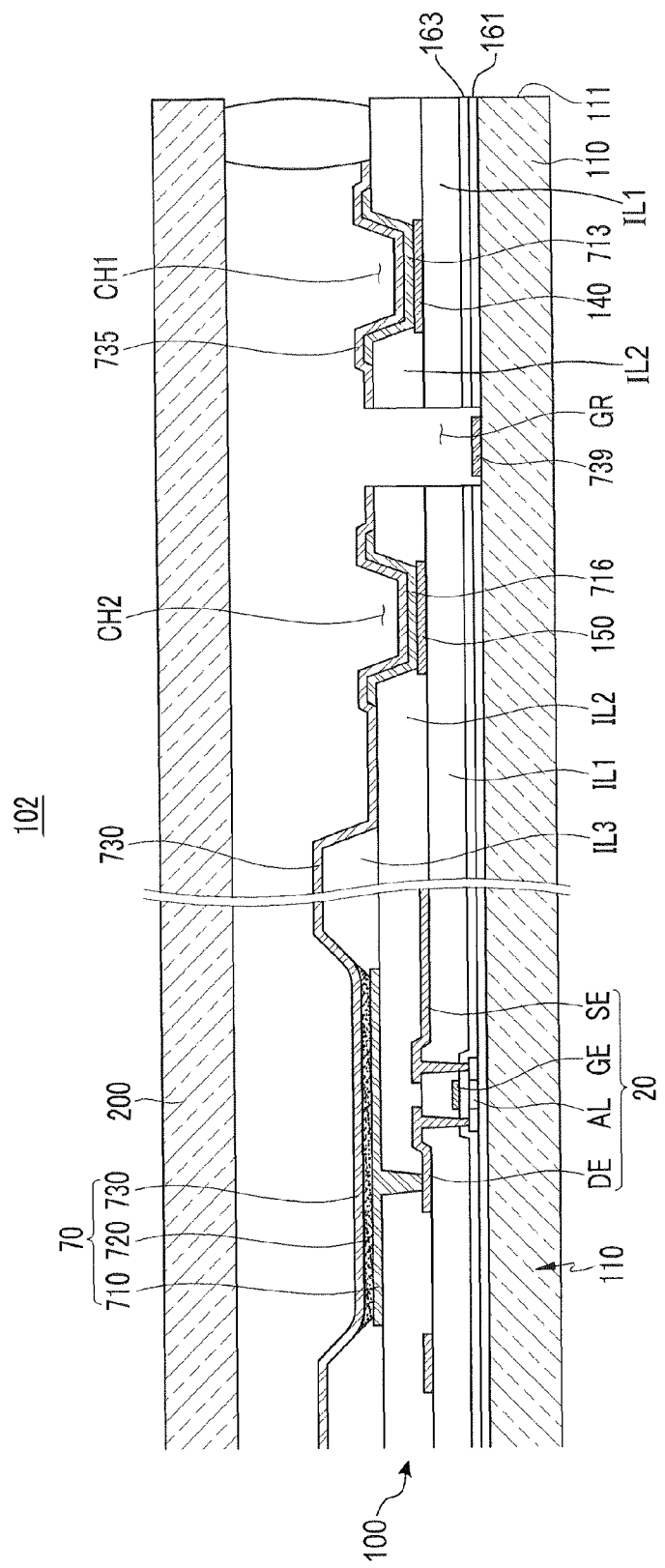
FIG. 4 is a partial cross-sectional view of FIG. 3, taken along the line IV-IV'.

As shown in FIG. 3 and FIG. 4, a common power bus line 140 for the OLED display device 102 constructed as the second embodiment is interposed between an organic light emitting element 70 and an edge 111 of the substrate 110. More specifically, the common power bus line 140 is interposed between a driving power bus line 150 and the edge 111 of the element substrate 100 so that the driving power bus line 150 is interposed between the common power bus line 140 and the organic light emitting element 70. The common power bus line 140 is disposed on the substrate 110, with a first insulation layer IL1 being interposed between the common power bus line 140 and the substrate 110, and the common power bus line 140 is electrically connected with a first electrode 710 through a common power line VDDL and a second thin film transistor 20 to supply first electrical power VDD to the first electrode 710. Corresponding to the common power bus line 140, a connection wire 735 is disposed on the common power bus line 140, with a first auxiliary layer 713 interposed between the common power bus line 140 and the connection wire 735.

The first auxiliary layer 713 contacts the connection wire 735 and the common power bus line 140 and the first auxiliary layer 713 is interposed between the common power bus line 140 and the connection wire 735. The first auxiliary layer 713 minimizes electrical resistance of common power bus line 140. The first auxiliary layer 713 is made of the same material as the first electrode 710. That is, the first auxiliary layer 713 and the first electrode may be simultaneously formed by one process such as a photolithography process for forming the first electrode 710.

The connection wire 735 is disposed on the common power bus line 140, by interposing a second insulation layer IL2 therebetween, and the connection wire 735 is electrically connected with the common power bus line 140, by interposing the first auxiliary layer 713 through a first contact hole CH1. The first contact hole CH1 is formed within the second insulation layer IL2 to expose the common power bus line 140 in order to electrically connect the common power bus line 140 to the connection wire 735. The connection wire 735 is electrically separated from the second electrode 730, with a groove GR interposed between the connection wire 735 and the second electrode 730. In one embodiment, the connection wire 735 may be electrically and physically separated from the second electrode 730. The connection wire 735 is electrically connected with the common power bus line 140 together with the first auxiliary layer 713 in order to minimize electrical resistance of the common power bus line 140, and accordingly, a loss of the first electrical power VDD supplied to the first electrode 710 through the common power bus line 140 may be minimized. That is, since the loss of the first electrical power VDD, which is common power supplied to the first electrode 710 of the organic light emitting element 70, is minimized, the light efficiency of the organic light emitting element 70 is enhanced and accordingly the display quality of the OLED display device 102 may be concomitantly improved.

The second electrode 730 is extended from a portion corresponding to the organic emission layer 720 and is separated from the connection wire 735 by the groove GR. The second electrode 730 is electrically connected with the driving power bus line 150, with a second auxiliary layer 716 interposed between the second electrode 730 and the driving power bus line 150. A second contact hole CH2 is formed within the second insulation layer IL2 to expose the driving power bus line 150.

The second auxiliary layer 716 respectively contacts the second electrode 730 and the driving power bus line 150 and the second auxiliary layer 716 is disposed between the driving power bus line 150 and the second electrode 730 in order to minimize electrical resistance of the driving power bus line 150 and the second electrode 730. The second auxiliary layer 716 is made of the same material as the first electrode 710. That is, the second auxiliary layer 716 is simultaneously formed with the first electrode 710 and the first auxiliary layer 713 through a single process such as the photolithography process for forming the first electrode 710.

As described in the foregoing paragraphs, the second power VSS which is driving power supplied from the driving power bus line 150 is supplied to the second electrode 730 corresponding to the organic emission layer 720 through the second electrode 730 that is electrically connected with the driving power bus line 150, by interposing the second auxiliary layer 716 through the second contact hole CH2. The electrical resistance of the driving power bus line 150 and the second electrode 730 therefore may be minimized through the electrical connection with the driving power bus line 150 so that a loss of the second power VSS supplied to the second electrode 730 through the driving power bus line 150 may be minimized. That is, since the loss of the second power VSS, which is the driving power supplied to the second electrode 730 of the organic light emitting element 70, may be minimized, the light efficiency of the organic light emitting element 70 will be concomitantly enhanced and the display quality of the OLED display 102 may be improved.

The groove GR is disposed between the connection wire 735 and the second electrode 730, and the groove GR has a groove shape with the recessed first insulation layer IL1 and the second insulation layer IL2. The groove GR exposes the substrate 110, and since the groove GR forms a predetermined height of step between the connection wire 735 and the second electrode 730 by exposing the substrate 100, the second electrode 730 and the connection wire 735 are electrically separated from each other by the groove GR when forming the second electrode 730 over the entire area of the substrate 110 through a single process such as a deposition process. The second electrode 730 and the connection wire 735 may be formed to be physically separated. That is, the second electrode 730 and the connection wire 735 may be formed to be electrically and/or physically separated from each other by the groove GR through one process for forming the second electrode 730 without using an additional process such as an etching process so that a short-circuit between the second electrode 730 and the connection wire 735 may be prevented, and the connection wire 735 is formed when the second electrode 730 is formed so that electrical resistance of the common power bus line 140 may be minimized without any need to perform an additional process or fabrication step. A second dummy layer 739 is formed within the void of the groove GR.

The second dummy layer 739 includes the same material as the second electrode 730, and is electrically and/or physically separated from the second electrode 730 and the connection wire 735. The second dummy layer 739 is formed together with the second electrode 730 and the connection wire 735 when forming the second electrode 730 and is disposed in the groove GR.

As described in the forgoing paragraphs, in the OLED display device 102 constructed as the second embodiment, the common power bus line 140 is electrically connected with the connection wire 735 including the same material as the second electrode 730 by contacting the first auxiliary layer 713 including the same material as the first electrode 710 so that electrical resistance of the common power bus line 140 may be minimized, and accordingly, a loss of the first power VDD supplied to the first electrode 710 through the common power bus line 140 may be minimized. The second electrode 730 is electrically connected with the driving power bus line 150 by contacting the first auxiliary layer 713 including the same material as the first electrode 710, so that electrical resistance of the driving power bus line 150 may be minimized, and accordingly, a loss of the second power VSS supplied to the second electrode 150 may be minimized. That is, the loss of the first power VDD and the second power VSS respectively supplied to the first and second electrodes 710 and 730 of the organic light emitting element 70 may be minimized so that light efficiency of the organic light emitting element 70 may be enhanced and the display quality of the OLED display device 102 may be improved.

In addition, in the OLED display device 102 constructed as the second embodiment, the connection wire 735 and the second electrode 730 are formed through a single process for forming the second electrode 730 by the groove GR so that electrical resistance of the driving power bus line 150 may be minimized, without the necessity of performing an additional process. That is, the electrical resistance of the driving power bus line 150 may be minimized without increasing the costs of fabrication and without incurring additional manufacturing costs so that the display quality of the OLED display device 102 may be improved.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a substrate;
   an organic light emitting element including a first electrode disposed on the substrate, an organic emission layer disposed on the first electrode, and a second electrode disposed on the organic emission layer;
   a common power bus line disposed between the organic light emitting element and an edge of the substrate on the substrate, and the common power bus line electrically connected with the first electrode;
   a driving power bus line neighboring the common power bus line on the substrate, disposed between the organic light emitting element and the edge of the substrate, and the driving power bus line electrically connected with the second electrode that is extended from a portion corresponding to the organic emission layer; and
   a connection wire comprised of a same material forming the second electrode, the connection wire disposed on the common power bus line and electrically separated from the second electrode, and the connection wire electrically connected with the common power bus line.

2. The OLED display device of claim 1, further comprising:
   a protruded spacer interposed between and physically separating the connection wire and the second electrode; and
   a first dummy layer disposed on the spacer and the first dummy layer comprised of the same material forming the second electrode.

3. The OLED display device of claim 2, wherein the spacer comprises a reverse taper-shaped side.

4. The OLED display device of claim 1, further comprising:
   a groove interposed between the connection wire and the second electrode; and
   a second dummy layer disposed within the groove and made of the same material forming the second electrode.

5. The OLED display device of claim 4, wherein the groove exposes the substrate.

6. The OLED display device of claim 1, wherein the second electrode electrically contacts the driving power bus line.

7. The OLED display device of claim 1, wherein the connection wire electrically contacts the common power bus line.

8. The OLED display device of claim 1, further comprising a first auxiliary layer respectively physically contacting the connection wire and being disposed the common power bus line between the connection wire and the common power bus line, and the first auxiliary layer being made of a first auxiliary layer made of the same material forming the first electrode.

9. The OLED display device of claim 1, further comprising a second auxiliary layer physically contacting the second electrode and the driving power bus line and being disposed between the second electrode and the driving power bus line, and the second auxiliary layer made of the same material forming the first electrode.

10. The OLED display device of claim 1, wherein the common power bus line is interposed between the driving power bus line and the organic light emitting element.

11. The OLED display device of claim 1, wherein the driving power bus line is interposed between the common power bus line and the organic light emitting element.

12. An organic light emitting diode (OLED) display device, comprising:
    a first substrate and a second substrate, with the second substrate being disposed opposite to and spaced apart from the first substrate;
    an organic light emitting element disposed on the first substrate, the organic light emitting element including a first electrode and a second electrode with an organic emission layer interposed between the first and second electrodes, with the second electrode facing toward the second substrate;
    a common power bus line electrically connected with the first electrode;
    a driving power bus line disposed on the first substrate and neighboring the common power bus line, and the driving power bus line electrically connected with the second electrode that is extended from a portion corresponding to the organic emission layer; and
    a connection wire comprised of a same material forming the second electrode, the connection wire disposed in direct contact with the common power bus line and completely physically separated from the second electrode.

13. The OLED display device of claim 12, further comprising:
    a spacer protruding from the first substrate toward the second substrate, the spacer completely physically separating the connection wire from the second electrode; and
    a first dummy layer disposed on the spacer and the first dummy layer comprised of the same material forming the second electrode.

14. The OLED display device of claim 12, further comprising:
    a groove interposed between the connection wire and the second electrode and completely physically separating the connection wire from the second electrode; and
    a second dummy layer disposed within the groove and the second dummy layer being made of the same material forming the second electrode.

15. The OLED display device of claim 12, wherein the second electrode electrically contacts the driving power bus line.

16. The OLED display device of claim 12, wherein the connection wire electrically contacts the common power bus line.

17. The OLED display device of claim 12, further comprising a first auxiliary layer respectively physically contacting the connection wire and the common power bus line and the first auxiliary layer being disposed between the connection wire and the common power bus line, and the first auxiliary layer being made of the same material forming the first electrode.

18. The OLED display device of claim 12, further comprising a second auxiliary layer physically contacting the second electrode and the driving power bus line, and the second auxiliary layer made of the same material forming the first electrode.

19. The OLED display device of claim 12, wherein the common power bus line and the driving power bus line are disposed between the organic light emitting element and an edge of the substrate on the substrate.

* * * * *